(12) United States Patent
Lee

(10) Patent No.: US 9,087,986 B2
(45) Date of Patent: Jul. 21, 2015

(54) SEMICONDUCTOR MEMORY DEVICE HAVING DUMMY CONDUCTIVE PATTERNS ON INTERCONNECTION AND FABRICATION METHOD THEREOF

(71) Applicant: SK hynix Inc., Gyeonggi-do (KR)

(72) Inventor: Jang Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/274,428

(22) Filed: May 9, 2014

(65) Prior Publication Data

US 2014/0248765 A1    Sep. 4, 2014

Related U.S. Application Data

(62) Division of application No. 13/598,303, filed on Aug. 29, 2012, now Pat. No. 8,759,979.

(30) Foreign Application Priority Data

Oct. 24, 2011    (KR) .......................... 10-2011-0108591

(51) Int. Cl.
*H01L 45/00* (2006.01)
*H01L 27/24* (2006.01)

(52) U.S. Cl.
CPC ........ *H01L 45/1253* (2013.01); *H01L 27/2409* (2013.01); *H01L 27/2463* (2013.01); *H01L 45/06* (2013.01); *H01L 45/1233* (2013.01); *H01L 45/16* (2013.01)

(58) Field of Classification Search
CPC ............. G11C 13/0069; G11C 13/004; G11C 13/003; G11C 17/14; G11C 17/165; G11C 14/009; G11C 2213/30; H01L 27/11206; H01L 27/1052
See application file for complete search history.

(56) References Cited

U.S. PATENT DOCUMENTS

| 6,335,890 | B1 * | 1/2002 | Reohr et al. | 365/225.5 |
|---|---|---|---|---|
| 6,340,588 | B1 * | 1/2002 | Nova et al. | 506/16 |
| 6,838,869 | B1 * | 1/2005 | Rogers et al. | 324/762.01 |
| 8,530,324 | B2 * | 9/2013 | Park et al. | 438/397 |
| 8,638,590 | B2 * | 1/2014 | Hao et al. | 365/148 |
| 2012/0075906 | A1 * | 3/2012 | Ho et al. | 365/148 |
| 2012/0241834 | A1 * | 9/2012 | Nakajima et al. | 257/316 |
| 2013/0099386 | A1 * | 4/2013 | Lee | 257/773 |

* cited by examiner

*Primary Examiner* — Evan Pert
*Assistant Examiner* — Gustavo Ramallo
(74) *Attorney, Agent, or Firm* — IP & T Group LLP

(57) ABSTRACT

A semiconductor memory device having a cell pattern formed on an interconnection and capable of reducing an interconnection resistance and a fabrication method thereof are provided. The semiconductor device includes a semiconductor substrate in which a cell area, a core area, and a peripheral area are defined and a bottom structure is formed, a conductive line formed on an entire structure of the semiconductor substrate, a memory cell pattern formed on the conductive line in the cell area, and a dummy conductive pattern formed on any one of the conductive line in the core area and the peripheral area.

2 Claims, 4 Drawing Sheets

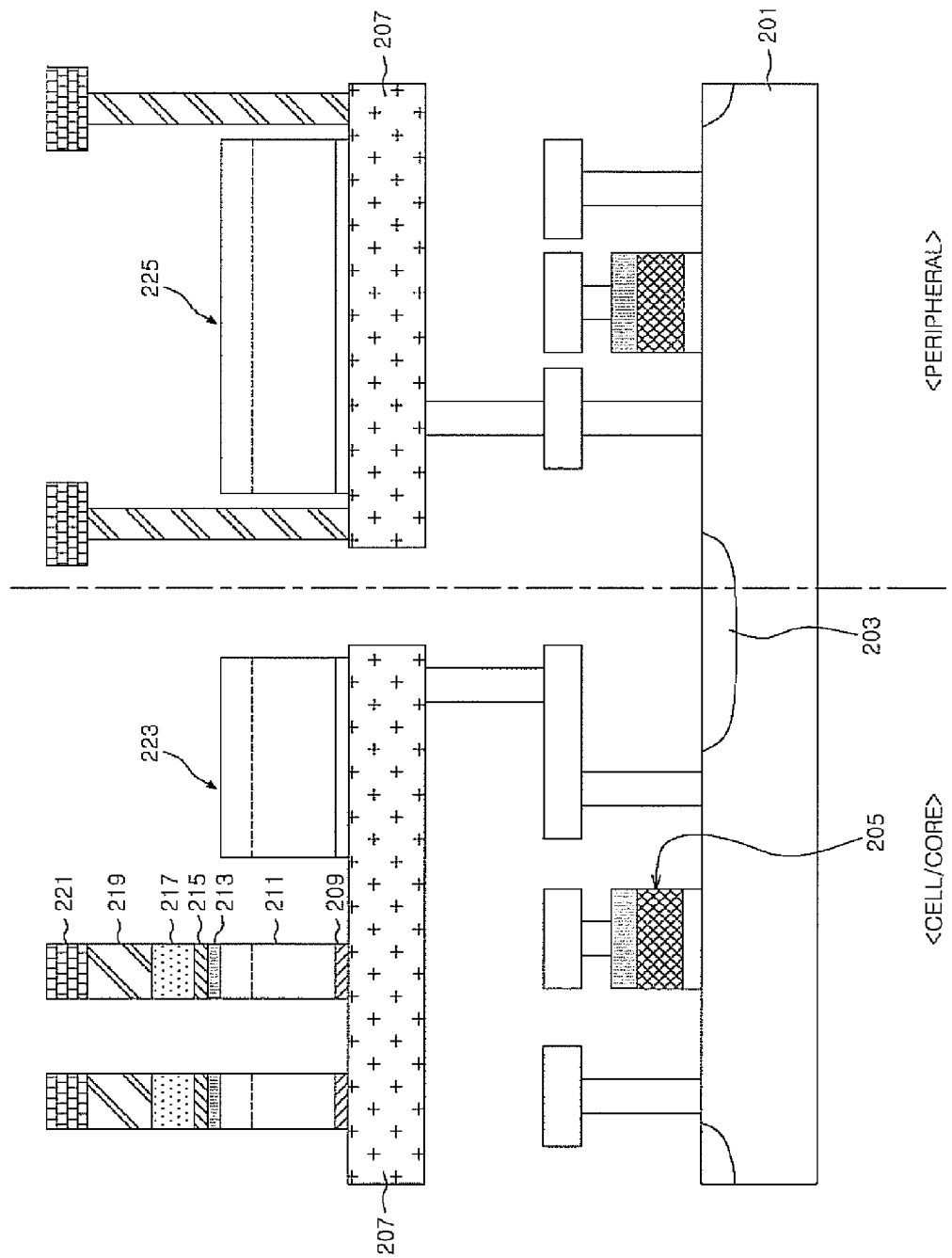

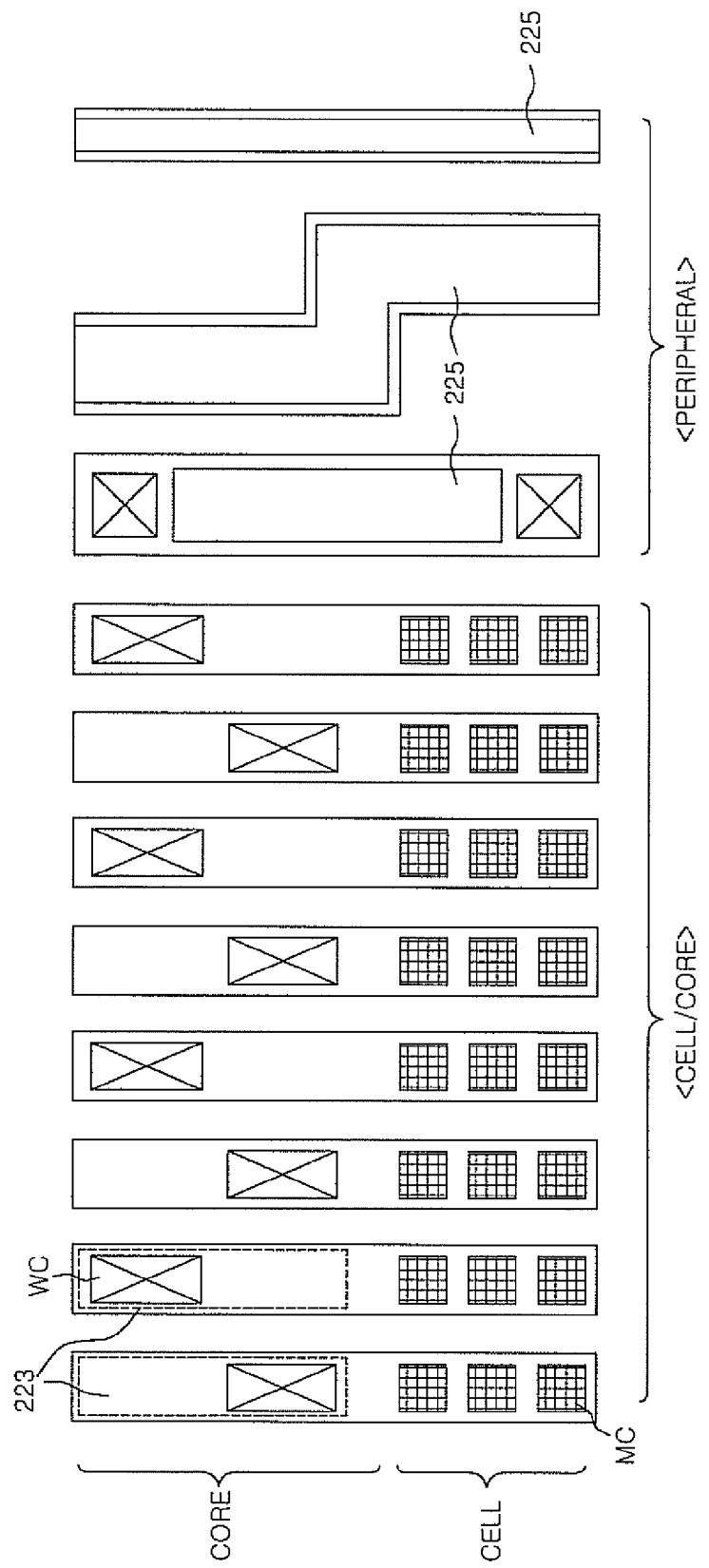

SEMICONDUCTOR MEMORY DEVICE HAVING DUMMY CONDUCTIVE PATTERNS ON INTERCONNECTION AND FABRICATION METHOD THEREOF

CROSS-REFERENCES TO RELATED APPLICATION

This application is a division of U.S. patent application Ser. No. 13/598,303 filed on Aug. 29, 2012, which claims priority under 35 U.S.C. 119(a) to Korean application number 10-2011-0108591, filed on Oct. 24, 2011. The disclosure of each of the foregoing application is incorporated by reference in its entirety.

BACKGROUND

1. Technical Field

The inventive concept relates to a method of fabricating a semiconductor memory, and more particularly, to a semiconductor memory device having cell patterns formed on an interconnection and a fabrication method thereof.

2. Related Art

In general, fabrication processes for a cell area, a core area and a peripheral area in a memory device are separately performed. However, the cell area, the core area and the peripheral area operate correlatively with each other. Accordingly, a structure of patterns and stacks should be formed to ensure operational and characteristic connections between correlated circuits in the cell area, the core area, and the peripheral area.

FIG. 1 is a cross-sectional view illustrating a structure of a semiconductor memory device, for example, a phase-change random access device (PCRAM).

An isolation layer 103 is formed on a semiconductor substrate 101 where a cell area, a core area, and a peripheral area are respectively defined. A switch 105 configured to select a word line is formed on the cell and core areas of the semiconductor substrate 101. At this time, a circuit pattern is also formed in the peripheral area to match the height of patterns or structures between the cell and core areas and the peripheral area.

A conductive line 107 is formed on the semiconductor substrate having the switch 105. The conductive line 107 may be formed using a metal material such as tungsten (W) and serve as a word line in a cell operation. The conductive line 107 in the cell and core areas is electrically connected to the switch 105 which is formed below the conductive line 107. The conductive line 107 in the peripheral area may contact with the underlying circuit pattern to serve as an interconnection.

A cell pattern is formed on the conductive line 107 in the cell and core areas. In particular, in the PCRAM device, the cell pattern is coupled to the conductive line 107 through an access element such as a diode.

The diode as the access element may include a barrier metal layer 109 and an N-type semiconductor layer 111; and further include a silicide layer, which could be formed by silicidation to a surface of the N-type semiconductor layer 111, to reduce a contact resistance. However, the diode is not limited thereto. In addition, a lower electrode 115, a phase-change material pattern 117, an upper electrode 119, and a bit line 121 are formed on the access element 109 and 111 (or 113) through general processes well known to one skilled in the art.

FIG. 2 is a layout of the semiconductor memory device illustrated in FIG. 1.

FIG. 2 illustrates that a plurality of unit memory cells MC are formed in a cell area, a word line contact WC is formed in a core area. Further, a contact for connection between a peripheral circuit and the cell area is formed in the peripheral area.

The unit memory cell of the memory device should have a size to guarantee an operational characteristic thereof. However, as the semiconductor device is highly integrated, a word line size (or width), that is, a critical dimension of the conductive line 107, decreases so that the series resistance of the conductive line 107 increases. The increased series resistance of the conduction line 107 cause voltage drop, thereby threatening a sensing margin.

To solve above-described concerns, the word line selection switch 105 should be designed to provide sufficient driving current on the conductive line 107. However, a large transistor is required to increase drivability of the switch 105, resulting in increase of a chip size.

As another method to solve the concerns, a method of forming a deep trench for the conductive line 107 may be considered. However, the method may be difficult to be applied because of restriction based on integration degree of the semiconductor memory device.

SUMMARY

According to one aspect of an exemplary embodiment, there is a provided a semiconductor device. The semiconductor device may include a semiconductor substrate in which a cell area, a core area, and a peripheral area are defined and a bottom structure is formed, a conductive line formed on an entire structure of the semiconductor substrate, a memory cell pattern formed on the conductive line in the cell area, and a dummy conductive pattern formed on any one of the conductive line in the core area and the peripheral area.

According to another aspect of an exemplary embodiment, there is a provided a method of fabricating a memory device having a cell pattern formed on an interconnection. The method may include forming a conductive line on an entire structure of a semiconductor substrate in which a cell area, a core area, and a peripheral area are defined, and forming a cell pattern on the conductive line in the cell area and a dummy conductive pattern on the conductive line in the core area and the peripheral area.

A semiconductor memory device includes a word line in a cell area, and a dummy pattern in a core area and a peripheral area, wherein the word line and the dummy pattern have the same structure and the same height from a semiconductor substrate level.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 3 is a cross-sectional view illustrating a structure of a semiconductor memory device according to an exemplary embodiment of the inventive concept; and FIG. 4 is a layout of the semiconductor memory device illustrated in FIG. 3.

DETAILED DESCRIPTION

Figure 1:
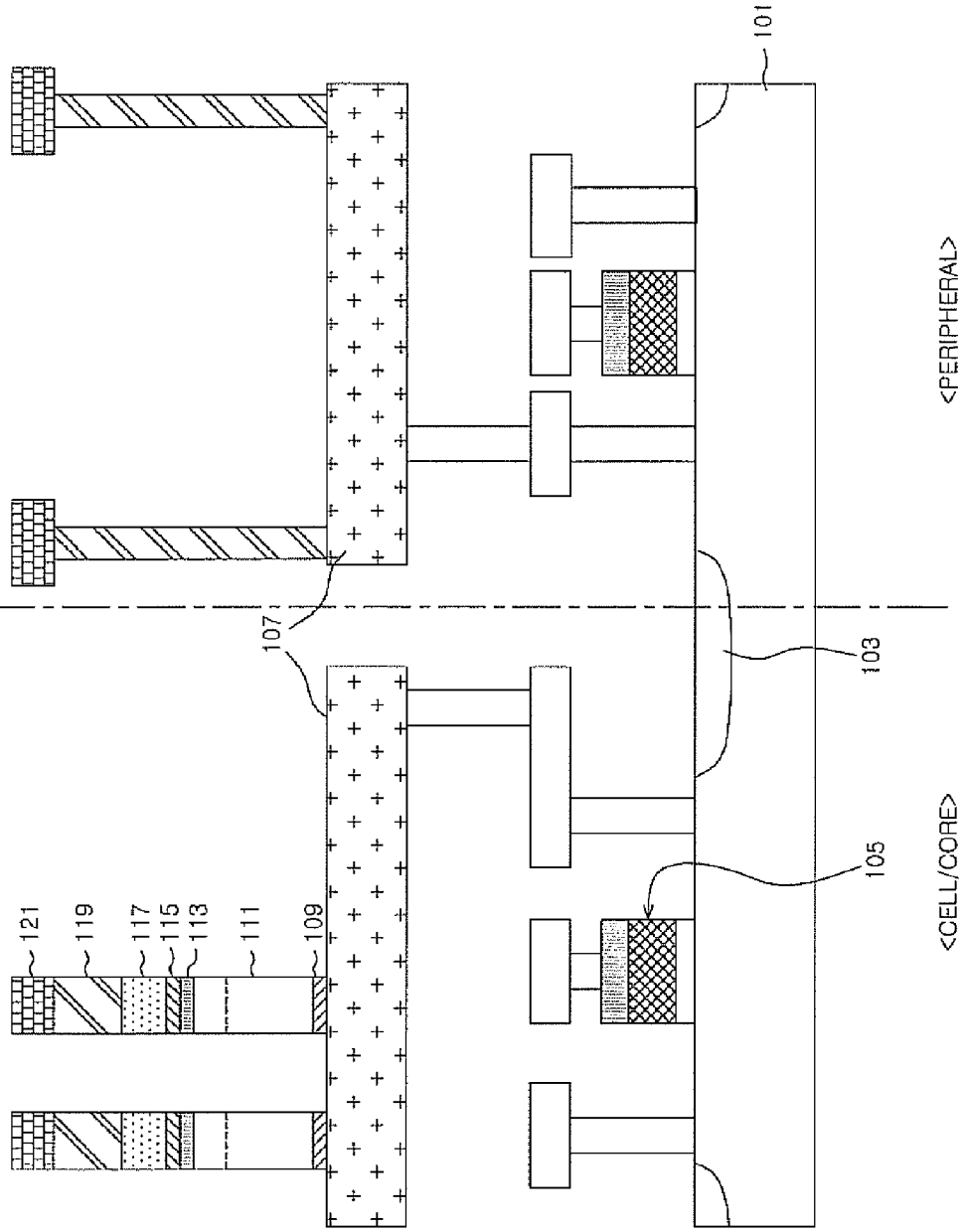
FIG. 1 is a cross-sectional view illustrating a structure of a general semiconductor memory device.
Figure 2:
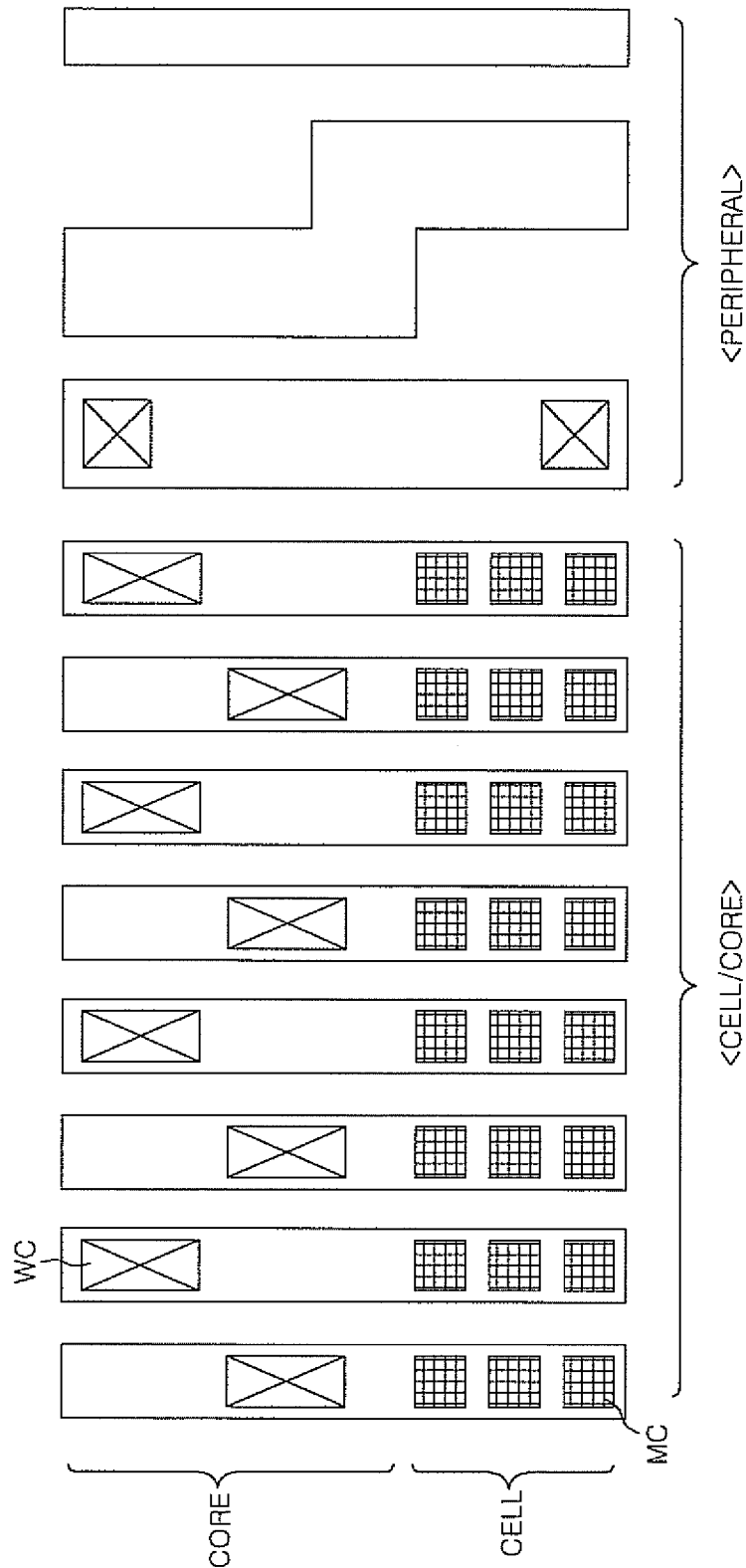
FIG. 2 is a layout of the semiconductor memory device illustrated in FIG. 1.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIG. 3 is a cross-sectional view illustrating a structure of a semiconductor memory device according to an exemplary embodiment of the inventive concept.

A semiconductor memory device according to an exemplary embodiment includes a cell pattern which is formed on a conductive line 207, preferably, a word line. The semiconductor memory device may include a PCRM, but the semiconductor memory device is not limited thereto.

The cell pattern is formed on the conductive line 207 in the cell area. Dummy conductive patterns 223 and 225 may be formed on the conductive line 207 in the core area and/or the peripheral area.

Hereinafter, the structure of the semiconductor memory device will be described below in detail.

An isolation layer 203 is formed in a semiconductor substrate 201 in which the cell area, the core area and the peripheral area are defined.

A switch 205 for word line selection is formed on the cell and core areas of the semiconductor substrate 201 including the isolation layer 203. At this time, a circuit pattern may be also formed in the peripheral area, for matching structures' height of the peripheral area with that of the cell and core areas.

Subsequently, the conductive line 207, which are electrically connected to the switch 205, are formed over an entire surface of the semiconductor substrate in which the switch 205 is formed. The conductive line 207 including a metal material such as tungsten (W) may serve as word lines.

The cell pattern and the dummy conductive pattern 223 are formed on the conductive line 207 of the cell and core areas, and, simultaneously, the dummy conductive pattern 225 is formed on the conductive line 207 of the peripheral area. That is, while an access element including layers 209 and 211 is formed on the conductive line 207 of the cell area, the dummy conductive patterns 223 and 225 like the access element are also formed in the core area and the peripheral area by forming and patterning the same materials.

Specifically, layers for the access element are sequentially formed over an entire structure of the semiconductor substrate in which the conductive line 207 are formed, and then the layers are etched for patterning. The access element may function as a diode. As the access element, the diode may have a stacked structure of a barrier metal layer 209 and an N-type semiconductor layer 211, but the diode is not limited thereto.

In addition, a silicide layer 213 may be formed by performing silicidation on an upper surface of the access element formed in the cell area.

Meanwhile, although FIG. 3 illustrates that the dummy conductive patterns 223 and 225 are formed on both the core area and the peripheral area, the inventive concept is not limited thereto. That is, the dummy conductive pattern may be selectively formed on the core area or the peripheral area.

Next, the cell pattern including a lower electrode 215, a phase-change material layer 217 and an upper electrode 219 may be formed on the access element and a bit line may be formed on the cell pattern. Detailed fabrication methods for the cell pattern and the bit line are well known to one skilled in the art.

The dummy conductive patterns 223 and 225 are respectively formed on the conductive line 207 of the core area and the conductive line 207 of the peripheral area. The dummy conductive patterns 223 and 225 may have the same structure as the access element. Referring to the example of FIG. 3, like the diode including the barrier metal layer 209 and the N-type semiconductor layer 211 functioning as the access element, the dummy conductive patterns 223 and 225 also have a stacked structure of the barrier layer 209 and the N type semiconductor layer 211.

FIG. 4 is a layout of the semiconductor memory device illustrated in FIG. 3.

Referring to FIG. 4, the dummy conductive patterns 223 and 225 are formed on the core area and the peripheral area. The dummy conductive patterns 223 and 225 are formed on the conductive line 207 to serve as a parallel resistance component against the conductive line 207.

The resistance of the conductive line 207 may be less recognized than the original resistance of the conductive line 207 because two similar resistances of the conductive line 207 and the dummy conductive patterns 223 and 225 are recognized in parallel.

When the conductive line 207 serves as a word line in a recording operation, voltage drop through the word line is reduced. Thus, a voltage applied for operation of the memory device may be reduced; and a sensing margin may be improved as compared with a conventional memory device which operates in the same applying voltage.

Further, a resistance component of the word line may be reduced without increase in drivability of the switch for controlling the word line so that burden on large transistor's drivability is reduced, dimension increase may be prevented, and a chip size may be reduced.

It is not required to form a deep trench for the word line on process; and thus burden on process development may be reduced. A height difference between the cell and core areas and the peripheral area decreases so that the height balance between the cell and core areas and the peripheral area may be improved and a fabrication yield may be increased.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of fabricating a semiconductor memory device, the method comprising:
   forming a conductive line on an entire structure of a semiconductor substrate in which a cell area, a core area, and a peripheral area are defined; and forming a cell pattern on the conductive line in the cell area and a dummy conductive pattern on the conductive line in the core area or the peripheral area, wherein the dummy conductive pattern serves as a parallel resistance component against the conductive line.

2. The method of claim 1, wherein the cell pattern includes an access element electrically connected to the conductive line in the cell area, and the dummy conductive pattern is simultaneously formed with the access element.

\* \* \* \* \*